United States Patent [19]

Alferness et al.

[11] Patent Number: 5,253,314
[45] Date of Patent: Oct. 12, 1993

[54] TUNABLE OPTICAL WAVEGUIDE COUPLER

[75] Inventors: Rodney C. Alferness, Holmdel; Lawrence L. Buhl, New Monmouth; Thomas L. Koch, Holmdel; Uziel Koren, Fair Haven, all of N.J.

[73] Assignee: AT&T Bell Laboratories, Murray Hill, N.J.

[21] Appl. No.: 830,092
[22] Filed: Jan. 31, 1992
[51] Int. Cl.$^5$ .................................................. G02B 6/26
[52] U.S. Cl. ........................................ 385/40; 385/1; 385/14
[58] Field of Search ...................... 385/40, 1, 14, 2, 9

[56] References Cited

U.S. PATENT DOCUMENTS 5,131,060 7/1992 Sakata ................................. 385/40 X
5,134,671 7/1992 Koren et al. ......................... 385/14

OTHER PUBLICATIONS

Alferness et al., "Broadly Tunable InGaAsP/InP Buried Rib Waveguide Vertical Coupler Filter" Technique Digest vol. 8, Apr. 1992, (pp. 9-11).
"Codirectionally Coupled Twin-Guide Laser Diode for Broadband Electronic Wavelength Tuning" Elec. Lett., Nov. 21, 1991, vol. 27, No. 24, pp. 2207-2209.

Primary Examiner—John D. Lee
Assistant Examiner—Phan T. Heartney
Attorney, Agent, or Firm—Eli Weiss

[57] ABSTRACT

Various optical functions are generated in accordance with the present invention of a novel broadly tunable monolithic wavelength selective coupler which can be integrated with a gain medium to form a broadly tunable laser. The tunable wavelength selective coupler supports a pair of asynchronous waveguides, an upper waveguide and a lower waveguide, in combination with a phase match course grating for coupling optical energy between said waveguides. One end of the lower waveguide terminates at an output facet. The corresponding end of the upper waveguide terminates in an optical signal absorbing medium. The other end of the lower waveguide is terminated to prevent optical energy from entering the waveguide; and, the corresponding end of the upper waveguide terminates at an input facet. The combination of a gain section and the monolithically tunable wavelength selective coupler forms a broadly tunable laser which is an important source of optical energy for a number of applications such as wavelength division multiplexed networks and switching systems. The laser frequency is determined by that wavelength $\lambda_0$ which satisifies the forward coupling phase match condition, $\lambda g = \Lambda |N_2 - N_1|$ of the coupler where $\Lambda$ is the coarse grating period and $N_1$, $N_2$ are the effective indices of the two waveguides. Wavelengths which are not coupled from the upper waveguide to the lower waveguide are attenuated in the optical signal absorbing means. Tuning of the laser wavelength is achieved by either injecting current into or applying a reverse bias voltage to the upper waveguide to decrease or increase its index respectively and change the coupled wavelength.

25 Claims, 5 Drawing Sheets

TUNABLE OPTICAL WAVEGUIDE COUPLER

TECHNICAL FIELD

This invention relates to the field of optical couplers and lasers and, in particular, to a monolithic tunable wavelength selective coupler which can be integrated with a gain medium to provide a tunable laser.

BACKGROUND OF THE INVENTION

Broadly tunable optical couplers are important components for a number of applications such as wavelength division multiplexed networks and switching systems. Other applications which can benefit from tunable wavelength selective couplers are noise filters for optical amplifiers and intercavity wavelength selective couplers for monolithic extended cavity lasers. In addition, further benefits can result if the monolithic wavelength selective coupler can be integrated with a photodetector, optical amplifier, laser and the like.

Currently, most monolithic tunable lasers, such as the distributed feedback (DFB) or distributed Bragg reflector (DBR) devices, are limited to a tuning range of about 10 nm when using current injection which produces the greatest electrically induced index change. This limitation of about 10 nm results from the fact that the fractional tuning range, $\Delta\lambda/\lambda$ of the fine-pitch Bragg grating wavelength-selective reflector is proportional to the normalized effective index change $\Delta N/N$.

In comparison, guided-wave bandpass transmission filters based upon forward coupling between asynchronous waveguide modes exhibit wavelength tuning at rates substantially greater than $\Delta N/N$. In a publication which appeared in Appl. Phys. Letters, 51, pp. 164-166, 1987 by F. Heismann et al., an electro-optically tunable filter based on periodic coupled mode conversion in lithium niobate waveguides was used as an inter-cavity filter in an early hybrid extended cavity laser to demonstrate broad laser tuning with a modest index change.

In a publication in Applied Phys. Letters, 59, pp. 2573-2575, 1991 by R. C. Alferness, it was reported that a grating-assisted vertical co-directional coupler can provide a bandpass filter and, in Tech. Digest, Integrated Photonics Research Meeting, Paper PDP8, Monterey, Calif., Apr. 9-11, 1991, R. C. Alferness et al. reported that this type of bandpass filter can be tuned over a range which is substantially wider than a grating reflector for the same induced refractive index change.

Recently, in electron. Letts., 27, pp. 2207-2209, Nov. 21, 1991, S. Illek, et al. reported on a tunable guide laser that includes a vertical coupler structure between two nearly synchronous guides. While evidence for extended tuning was observed, the tuning was unexpectedly irregular including, for example, sign reversal of the wavelength change.

Clearly, a monolithic implementation of a broadly tunable wavelength selective coupler which can be integrated with other devices, for example, an extended cavity gain means to form a tunable laser which is reliable in operation is needed.

SUMMARY OF THE INVENTION

Various optical functions are generated in accordance with the present invention of a novel broadly tunable monolithic wavelength selective coupler which can be integrated with a gain medium to form a broadly tunable laser. The tunable wavelength selective coupler supports a pair of asynchronous waveguides, an upper waveguide and a lower waveguide, in combination with a phase match course grating for coupling optical energy between said waveguides. One end of the lower waveguide terminates at an output facet. The corresponding end of the upper waveguide terminates in an optical signal absorbing medium. The other end of the lower waveguide is terminated to prevent optical energy from entering the waveguide; and, the corresponding end of the upper waveguide terminates at an input facet. The combination of a gain section and the monolithically tunable wavelength selective coupler forms a broadly tunable laser which is an important source of optical energy for a number of applications such as wavelength division multiplexed networks and switching systems. The laser frequency is determined by that wavelength $\lambda_o$ which satisfies the forward coupling phase match condition, $\lambda_g = \Lambda |N_2 - N_1|$ of the coupler where $\Lambda$ is the coarse grating period and $N_1$, $N_2$ are the effective indices of the two waveguides. Wavelengths which are not coupled from the upper waveguide to the lower waveguide are attenuated in the optical signal absorbing means. Tuning of the laser wavelength is achieved by either injecting current into or applying a reverse bias voltage to the upper waveguide to decrease or increase its index respectively and change the coupled wavelength.

DETAILED DESCRIPTION

Tunable, narrow-band wavelength selective couplers are an essential element for several important photonic integrated circuits which can include, for example, an amplifier-filter, demultiplexer-detector, tunable laser and the like.

Figure 1:
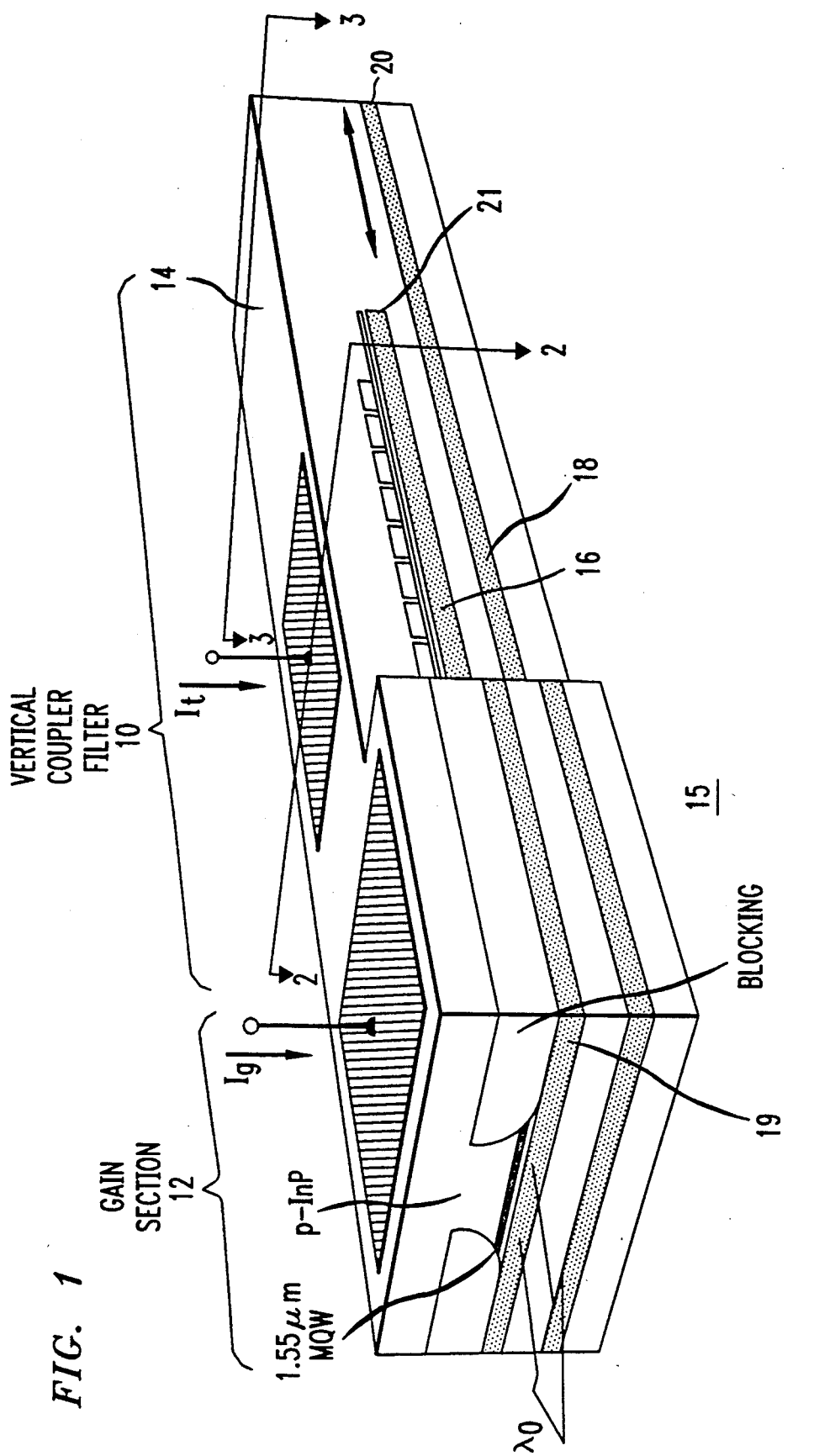
FIG. 1 is a partial cut-away schematic of a monolithic vertical coupler filter coupled to a gain section to form an extended cavity laser in accordance with the principles of the invention.

Referring to FIG. 1, there is illustrated an integrated grating-assisted vertical coupler 10 which operates as a tunable inter-cavity filter when coupled to a gain means 12 to form a laser 15.

The laser 15 is fabricated with three organic vapor phase epitaxy (MOVPE) growth steps and processed in a manner similar to that described in a publication entitled "Processes For Large Sclae Photonic Integrated Circuits" which appeared in Tech. Digest, Integrated and Guided-Wave Optics Conf., Paper MDD2, p. 68–71, Houston, Tex. 1988.

Figure 2:
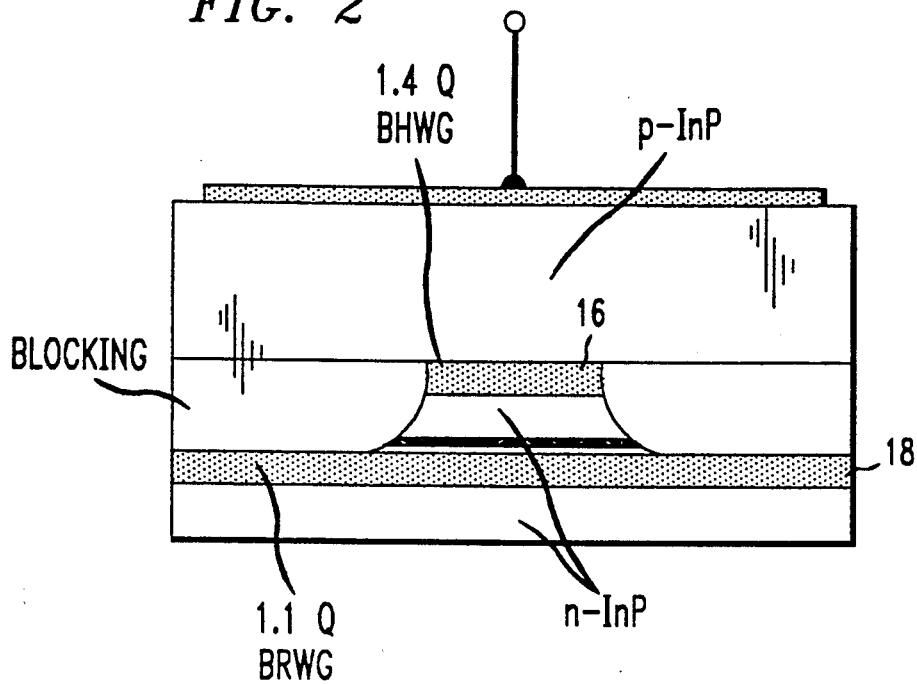
FIG. 2 is a sectional view along the line 2—2 of FIG. 1.
Figure 3:
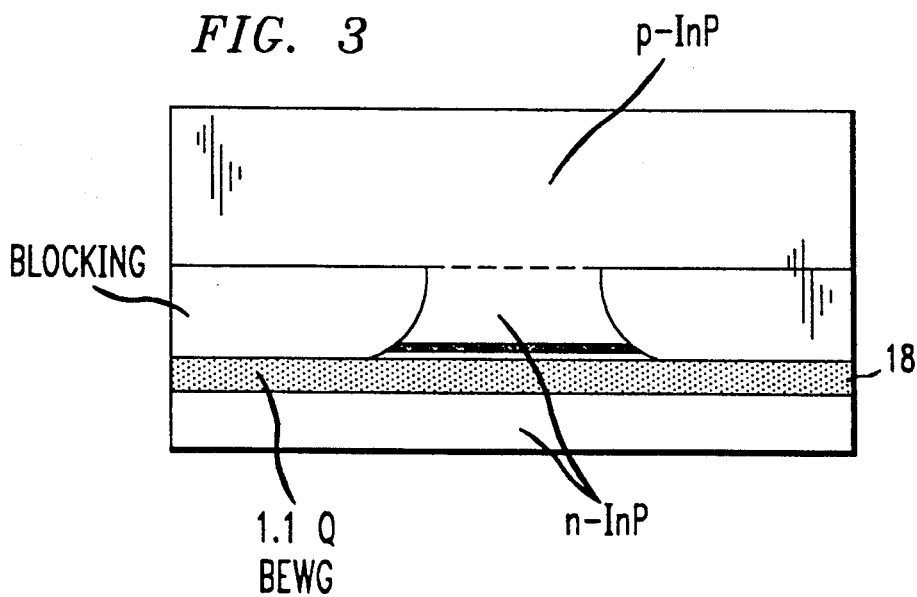
FIG. 3 is a sectional view along the line 3—3 of FIG. 1.

The upper waveguide 16 of the vertical coupler filter (VCF) 10 is a buried heterostructure formed with $\lambda_g = 1.4$ μm, 0.3 μm thick, InGaAsP material where the range of $\lambda_g$ is 1.25–1.45 μm. See FIG. 2 which is a sectional view of the vertical coupler filter 10 along the line A—A. Waveguide 16 also form a continuous buried rib waveguide upon which a multiple quantum well (MQW) active layer is grown to form the gain section 12. The MQW active layer consists of six 60 Å thick InGaAs quantum wells separated by 80 Å thick InGaAsP barriers. The MQW active layer is etched away in the passive sections.

The active-passive transition between the gain section 12 which is 60 μm long and the vertical coupler filter 10 is similar to that of the tunable distributed Bragg reflector and laser amplifier in the publication in Electron Letts., 24, pp. 1431–1432, 1988, by T. L. Koch et al.

The vertical coupler 10 includes a mode stripper section 14, in which the upper waveguide 16 is absent, it having been completely etched away. The length of the mode stripper section is 600 μm and the length of the filter section of the vertical coupler filter is 1.3 mm. The lower waveguide 18 of the vertical coupler filter 10 is a buried rib guide made with $\lambda_g = 1.1$ μm material having a core thickness of 0.26 μm and a rib height of 275 Å separated by a 500 Å thick InP layer where the range of $\lambda_g$ is 1.0–1.2 μm. The lower vertical coupler waveguide extends to rear facet 20 and has a Si/SiO$_2$ high reflection coating. In the gain section 12 the lower buried rib is not formed. Thus, in the gain section 12, the lower waveguide is terminated.

The coarse phase matching grating, which can have a period in the range of 5–100 microns, of the vertical coupler filter 10 has a period of $\Lambda = 16$ μm and is etched in a 350 Å thick $\lambda_g = 1.4$ μm layer on top of the upper buried heterostructure waveguide. See IEEE Photon. Tech. Letts., 3, pp. 899–901, 1991, by H. Sadata et al. The separation between the upper and lower waveguide is 0.8 μm. The upper waveguide of the vertical coupler filter 10 is 3 μm wide and the lower one is 3.2 μm wide. Electrical contacts are provided for applying a potential to or for injecting current into the gain section and the filter.

Figure 4:
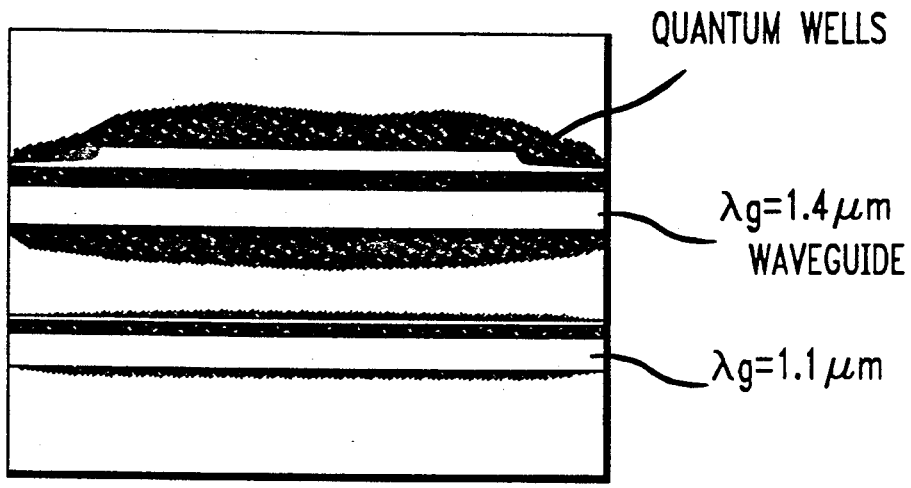
FIG. 4 is a line drawing of a scanning electron microscope photograph of the gain section.
Figure 5:
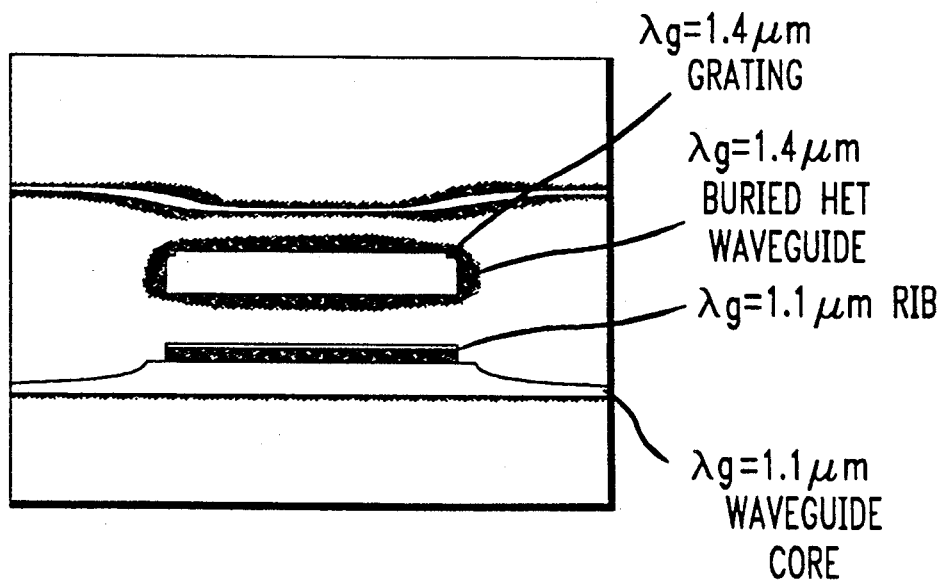
FIG. 5 is a line drawing of a scanning electron microscope photograph of the tunable vertical coupler filter.

A cross-sectional view of the gain section 12 and filter section 10 as seen by a scanning electron microscope is illustrated in FIGS. 4 and 5.

In operation, it is the vertical coupler filter 10 which provides the laser 15 with broad tunability. The vertical coupler filter consists of a pair of asynchronous waveguides 16, 18, each composed of a different InGaAsP composition. Because of the different effective indices, the overlay of the mode of each respective waveguide with the other waveguide is small, and light will not normally couple evanescently between the two waveguides. However, efficient codirectional coupling centered at a wavelength $\lambda o$ can be obtained between the two waveguides with a periodic coupling coefficient of the period, $\Lambda$.

The filter center wavelength $\lambda_o$ is defined by the relationship $\lambda_o = \Lambda \Delta N$ where $\Delta N(\lambda) = |N_2 - N_1|$ is the difference of the effective indices between the two waveguides. The interaction length which is needed for complete inter-waveguide coupling is dependent on the waveguide separation and grating depth.

The bandwidth of the wavelength selective inter-waveguide coupling which has a single passband response is given by the relationship $$\frac{\Delta \lambda}{\lambda} = 0.8 \frac{\Lambda}{L} \gamma$$

$$\text{where } \gamma = \left[ 1 - \Lambda \frac{\partial (\Delta N)}{\partial \lambda} |\lambda = \lambda_o \right]^{-1}$$

It is noted in the publication Appl. Phys. Letters, 55, pp. 2011–2013, 1989 by R. C. Alferness et al. that $\gamma$ is a bandwidth narrowing factor which results from the difference in material dispersion of the two waveguides at the operating wavelength. The filter center wavelength $\lambda o$ when $\Lambda$ is fixed can be changed by changing the index difference between the two waveguides. The wavelength change, $\delta \lambda$, for an induced change in the index difference between the two waveguides $\delta(\Delta N)$, as determined from the publication in Tech. Digest, Integrated Photonics Research Meeting, Paper PDP8, Monterey, Calif., Apr. 9–11, 1991 by R. C. Alferness et al. is $$\frac{\delta \lambda}{\lambda_o} = \gamma \frac{\delta(\Delta N)}{\Delta N}$$

The wide tunability of this laser results from the fact that the wavelength shift of the vertical coupler filter 10 depends upon the induced index change relative to the initial index difference between the two waveguides. It is not related to the waveguide index as in the case of reflection gratings. It is to be noted that the sign of filter tuning depends upon whether the value $\Delta N$ is increased or decreased. For a negative index change induced by carrier injection, both $\Delta N$ and $\lambda$ can be increased or decreased by current injection in the lower or higher index waveguide respectively.

Specifically, in each instance, for the same induced effective index change, the enhancement in tuning a vertical coupler filter compared to a distributed Bragg reflector tuned laser is given by the relationship $$\left[ \frac{\delta \lambda_{VCF}}{\delta \lambda_{DBR}} \right] = \frac{\gamma}{2} \frac{\Lambda_{VCF}}{\Lambda_{DBR}}$$

For the design here disclosed, the tuning enhancement is about 12. While this enhancement can be increased further by reducing the initial $\Delta N$ to increase $\Lambda_{VCF}$, it is to be noted that the filter bandwidth should be narrow enough to provide the desired longitudinal mode selectivity. A very large index difference between the two waveguides was selected to narrow the intercavity filter bandwidth while still offering an extremely large tuning enhancement over that of reflection grating based lasers. If it is assumed that the 1.3 mm long vertical coupler filter has unity coupling length, the expected double pass (round trip) effective filter bandwidth is 25 Å.

The tunable laser 15 cavity extends from the reflective facet 19 of the upper waveguide at the end of gain section 12 through the wavelength selective vertical coupler filter 10 to the high reflective facet 20 of lower waveguide. The lasing wavelength is determined by the overlap of the filter center wavelength of the tuned vertical coupler filter and the FP modes of the laser cavity. Light of this wavelength is coupled from the upper waveguide to the lower waveguide, and then reflected by the high reflective facet at the end of the lower waveguide for the return trip. Wavelengths not coupled from the upper waveguide to the lower waveguide exit the terminated end 21 of the upper waveguide and are strongly terminated by diffraction in the mode stripper section 14. This termination could also be accomplished by absorption.

It is noted that, even at the phase match wavelength, 100% coupling efficiency is difficult to achieve. In the design here disclosed, lateral confinement of the optical signal by the rib of the lower waveguide under the gain section is eliminated. This is to avoid potentially undesirable three mirror cavity effects that could result if light, which is not completely coupled back to the upper waveguide, is reflected back into the lower waveguide by the end facet of the lower waveguide. Assuming that the filter is the dominant wavelength selected element in the cavity, either current injection or reverse bias to the upper ($\lambda_g = 1.4$ μm) waveguide can be used to tune the vertical coupler filter and change the lasing wavelength.

Figure 6:
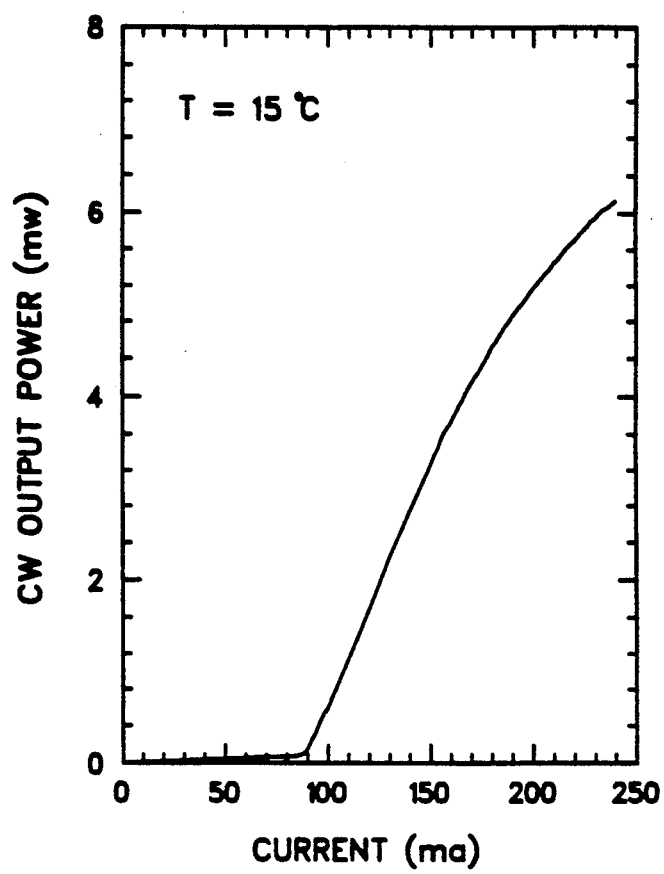
FIG. 6 is a graph of light output in mw versus current in ma to the gain section (Ig) for zero tuning current (It=0)
Figure 7:
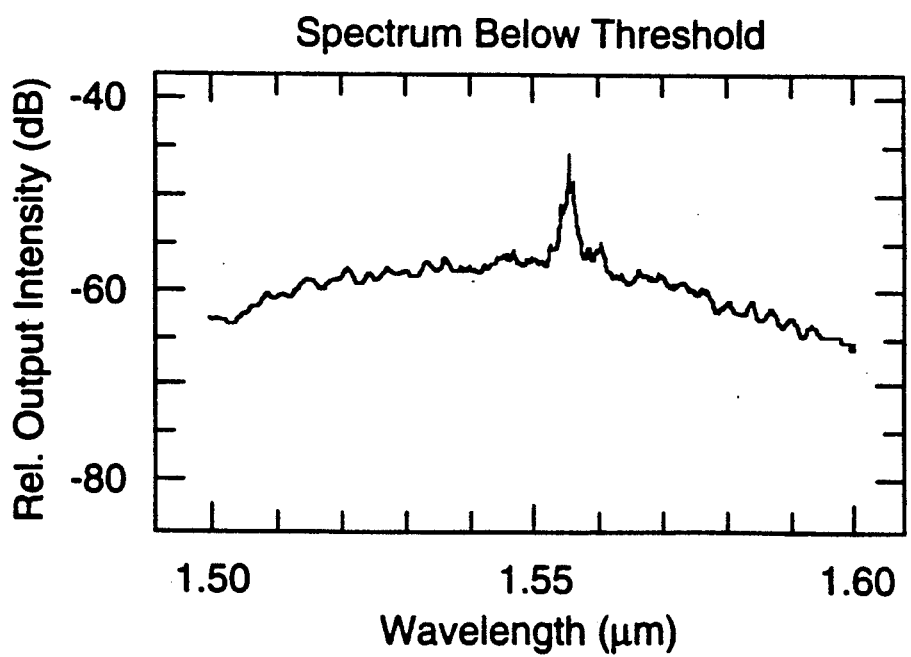
FIG. 7 is a graph of the below threshold output spectrum for zero tuning current.
Figure 8:
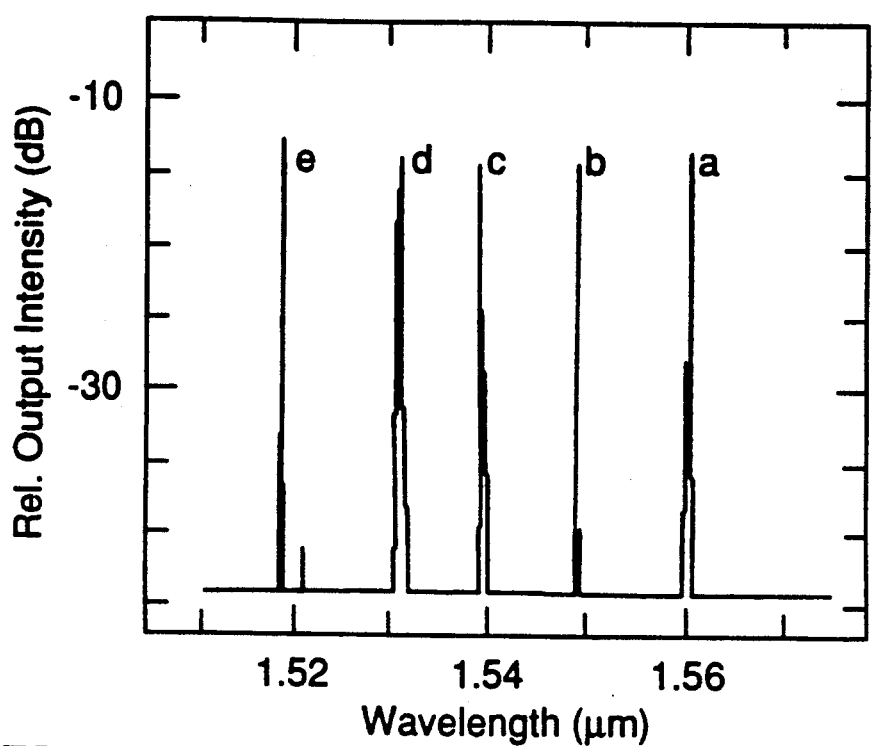
FIG. 8 is a graph of measured laser tuning characteristics.
Figure 9:
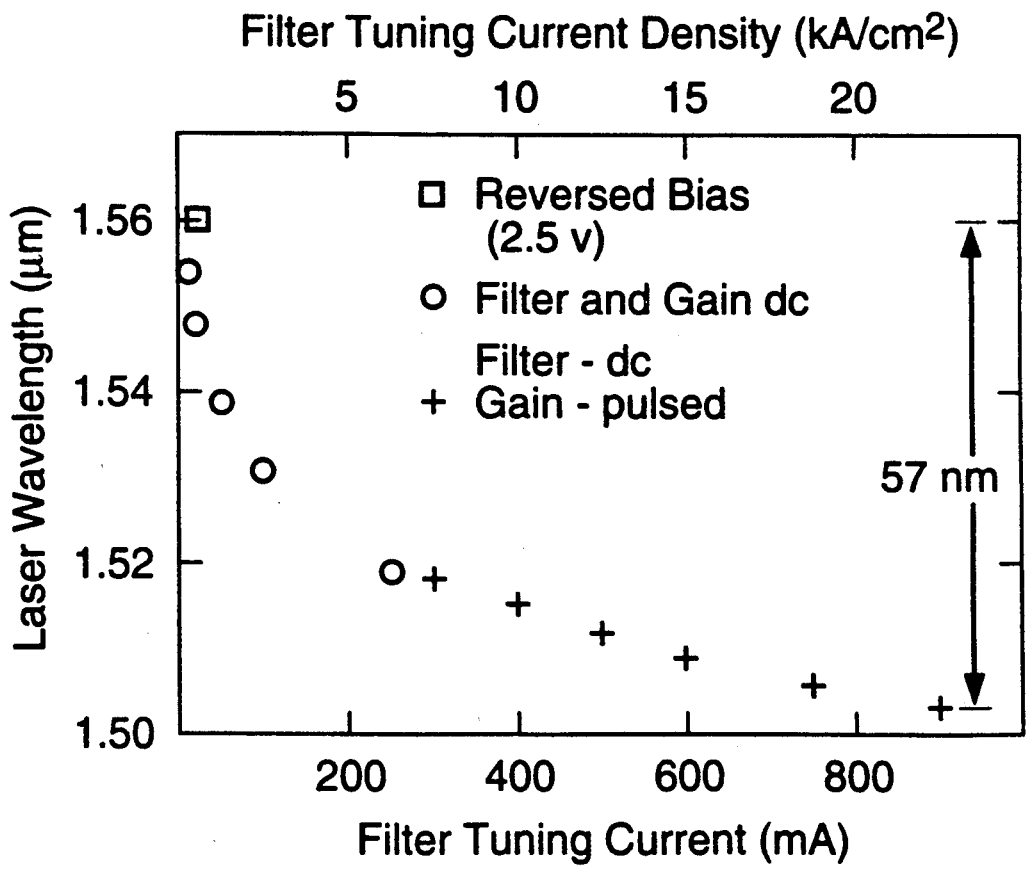
FIG. 9 is a graph of measured lasing wavelength as a function of tuning current and estimated current density on the filter electrode.

The CW light/current characteristic of the tunable laser 15 with no tuning current is shown in FIG. 6. Threshold current of 85 mA, with about 7% external quantum efficiency, and maximum output power higher than 6 mW were observed. The below threshold spectrum for zero tuning current, illustrated in FIG. 7, shows the vertical coupler filter response to be a peak of about 30 Å (FWHM) wide superimposed on the spontaneous emission spectrum which corresponds to the vertical coupler filter pass band. Application of reverse bias or current injection to the upper waveguide will move this below threshold filter peak to longer or shorter wavelengths, respectively. The above threshold lasing wavelength was observed to be at this filter peak, which indicates that it is the dominant wavelength selective element. The above threshold spectra for a single value of reversed bias and several tuning currents are shown in FIG. 8. Although the Fabry Perot mode spacing of the entire 2.6 mm long cavity is only about 1.2 Å, the relatively narrowband vertical coupler filter enables single mode operation to be maintained at most tuning currents. The measured lasing wavelength as a function of tuning current (and estimated current density) on the filter electrode is shown in FIG. 9. Included is the longest wavelength operation achieved with 2.5 volts reverse bias. CW tuning currents as high as 0.95 amps. were used, but because the filter section is 1.3 mm long, this does not lead to uncommonly high current densities. The laser section was operated CW for most of the tuning range, but for the shortest wavelengths pulsed operation was used to obtain sufficient gain for lasing. It is here noted that, with the disclosed devices, a total tuning range of 57 nm was achieved.

Internal losses of the device can be reduced by carefully designing the grating strength for approximately 100% coupling efficiency of the filter. Relative wavelength selectivity, which is the key to single frequency operation, can be improved by increasing the length of the filter relative to the total cavity length.

The broad tunability of the vertical coupler filter and its ability to set the laser wavelength in a convenient, controllable manner, and, a multiple quantum well tunable laser based upon an integrated, broadly tunable vertical coupler intracavity filter is here disclosed. The laser, operating in the 1.55 μm region, has a measured tuning range of 57 nm which is unambiguously controlled by the tunable vertical coupler filter.

What has been described is merely illustrative of the application of the principles of the present invention. Other arrangements and methods can be implemented by those skilled in the art without departing from the spirit and scope of the present invention.

We claim:

1. An optical coupler
   comprising a monolithic planar structure supporting upper and lower aligned asynchronous waveguides each having a first and a second end,
   optical coupling means positioned to provide optical coupling between the upper and lower asynchronous waveguides at a wavelength where said upper and lower waveguides are substantially transparent to optical energy at said wavelength,
   the first end of said upper waveguide being terminated to prevent optical energy not coupled to the lower waveguide by the optical coupling means from reentering said upper waveguide,
   the corresponding first end of said lower waveguide terminating at a first facet, and
   the second end of said upper waveguide terminating at a second facet for passing an optical signal.

2. The optical coupler of claim 1 wherein said first end of said upper waveguide terminates at a mode stripper means.

3. The optical coupler of claim 2 wherein said mode stripper means terminates optical energy by absorption or diffraction.

4. The optical couples of claim 2 wherein said optical coupling means comprises
   longitudinally periodic refractive index variations in the monolithic planar structure.

5. The optical coupler of claim 4 wherein said longitudinally periodic refractive index variations are located above said upper waveguide.

6. The optical coupler of claim 4 wherein said longitudinally periodic refractive index variations are located between said upper and lower waveguides.

7. The optical coupler of claim 4 wherein
   said upper waveguide is laterally confined and of a first refractive index material, and
   said lower waveguide is of a second refractive index material.

8. The optical coupler of claim 7 wherein
   said upper waveguide has a buried heterostructure geometry having a core material with a bandgap wavelength $\lambda_g$ which lies within the range of $\lambda_g = 1.25 - 1.45$ μm, and
   said lower waveguide has a buried rib geometry having a core material with a bandgap wavelength $\lambda_g$ which lies within the range of $\lambda_g = 1.0 - 1.2$ μm.

9. The optical coupler of claim 7 wherein
   said longitudinally periodic refractive index variations comprises a course phase-match rating having a period which is in the range of 5-100 μm.

10. The optical coupler of claim 1 wherein the second end of
    said lower waveguide is terminated to prevent optical energy not coupled to the upper waveguide from said lower waveguide by said optical coupling means from being reflected back into said lower waveguide.

11. The optical coupler of claim 10 further comprising means to inject current into either the upper or lower waveguide to change its index and change the coupled wavelength.

12. The optical coupler of claim 10 further comprising
means to apply a reverse bias voltage to either the upper or lower waveguide to change its index and change the coupled wavelength.

13. A semiconductor laser
comprising a gain means coupled to the optical coupler of claim 1, and
said first facet of said lower waveguide being reflective.

14. The semiconductor laser of claim 13 wherein
the upper waveguide extends through said gain means and the second facet of said upper waveguide passes an output signal
the cavity for the laser is between said second facet of said upper waveguide and said highly reflective first facet of said lower waveguide.

15. The semiconductor laser of claim 14 wherein
the second end of said lower waveguide is terminated to prevent optical energy not coupled to the upper waveguide from said lower waveguide by said optical coupling means from being reflected back into said lower waveguide.

16. The semiconductor laser of claim 15 wherein said first end of said upper waveguide terminates at a mode stripper means.

17. The semiconductor laser of claim 16 wherein said mode stripper means terminates optical energy by absorption or diffraction.

18. The semiconductor of claim 16 wherein said optical coupling means comprises longitudinally periodic refractive index variations in the monolithic planar structure.

19. The semiconductor laser of claim 18 wherein
said longitudinally periodic refractive index variations are located between said upper and lower waveguides.

20. The semiconductor laser of claim 18 wherein
said upper waveguide is laterally confined and of a first refractive index material and
said lower waveguide is of a second refractive index material.

21. The semiconductor laser of claim 20 wherein
said upper waveguide has a buried heterostructure geometry having a core material with a bandgap wavelength $\lambda_g$ which lies within the range of $\lambda_g = 1.25 - 1.45$ $\mu$m, and
said lower waveguide has a buried rib geometry having a core material with a bandgap wavelength $\lambda_g$ which lies within the range of $\lambda_g = 1.0 - 1.2$ $\mu$m.

22. The semiconductor laser of claim 20 wherein
said longitudinally periodic refractive index variations comprises a coarse phase-match grating having a period which is in the range of 5-100 $\mu$m.

23. The semiconductor laser of claim 22 further comprising
means to inject current into either the upper or lower waveguide to change its index and change the coupled wavelength.

24. The semiconductor laser of claim 22 further comprising
means to apply a reverse bias voltage to either the upper or lower waveguide to change its index and change the coupled wavelengths.

25. The semiconductor laser of claim 16 wherein said longitudinally periodic refractive index variations are located above said upper waveguide.

* * * * *